(12) United States Patent  
Metzler

(10) Patent No.: US 7,030,680 B2
(45) Date of Patent: Apr. 18, 2006

(54) ON CHIP POWER SUPPLY

(75) Inventor: Richard A. Metzler, Mission Viejo, CA (US)

(73) Assignee: Integrated Discrete Devices, LLC, Costa Mesa, CA (US)

( * ) Notice: Subject to any disclaimer, the term of this patent is extended or adjusted under 35 U.S.C. 154(b) by 0 days.

(21) Appl. No.: 10/758,083

(22) Filed: Jan. 16, 2004

(65) Prior Publication Data

US 2004/0164785 A1 Aug. 26, 2004

Related U.S. Application Data

(60) Provisional application No. 60/451,060, filed on Feb. 26, 2003.

(51) Int. Cl.
*H03K 17/687* (2006.01)

(52) U.S. Cl. ..................... 327/427; 327/434
(58) Field of Classification Search ............. 327/427, 327/434, 493
See application file for complete search history.

(56) References Cited

U.S. PATENT DOCUMENTS

| | | | | |
|---|---|---|---|---|
| 4,535,251 A * | 8/1985 | Herman et al. | ............. | 250/551 |
| 5,347,231 A | 9/1994 | Bertuccio et al. | ........... | 330/300 |
| 5,734,563 A | 3/1998 | Shinada | ....................... | 363/21 |
| 5,825,079 A | 10/1998 | Metzler et al. | ............ | 257/653 |
| 6,038,148 A | 3/2000 | Farrington et al. | ........... | 363/21 |
| 6,208,191 B1 * | 3/2001 | Alexander | .................... | 327/309 |
| 6,297,970 B1 | 10/2001 | Hemena et al. | .......... | 363/21.06 |
| 6,420,757 B1 | 7/2002 | Metzler | ....................... | 257/341 |
| 6,433,370 B1 | 8/2002 | Metzler | ....................... | 257/263 |
| 6,537,921 B1 | 3/2003 | Metzler | ....................... | 438/719 |
| 6,566,936 B1 * | 5/2003 | Yu | ............................. | 327/430 |
| 6,580,150 B1 | 6/2003 | Metzler | ....................... | 257/594 |

FOREIGN PATENT DOCUMENTS

| | | |
|---|---|---|
| EP | 0 880 225 A2 | 11/1998 |
| EP | 0 880 225 A3 | 1/2001 |
| FR | 2612022 A * | 9/1988 |
| JP | 10215568 A * | 8/1998 |

* cited by examiner

*Primary Examiner*—Quan Tra
(74) *Attorney, Agent, or Firm*—Blakely, Sokoloff, Taylor & Zafman LLP

(57) ABSTRACT

A technique, for drawing power from the external signal circuit to power on-chip elements for an integrated circuit diode (ICD), utilizes an integrated diode and capacitor. The capacitor is charged by the external applied voltage during the time the ICD blocks the external current flow. The charged capacitor then acts as a battery to power the on-chip circuits to provide active control for the ICD function. This ICD could be provided as a two terminal discrete diode, or integrated onto a larger IC. This same technique can be utilized for a "self powered" MOSFET IC (ICM), utilizing a low power logic signal to trigger an internal circuit which would provide a much larger gate drive than the logic signal could provide. This could also be provided as discrete three terminal components, or integrated into a larger IC.

19 Claims, 4 Drawing Sheets

ON CHIP POWER SUPPLY

CROSS-REFERENCE TO RELATED APPLICATION

This application claims the benefit of U.S. Provisional Patent Application No. 60/451,060 filed Feb. 26, 2003.

BACKGROUND OF THE INVENTION

1. Field of the Invention

The present invention relates to integrated circuit semiconductor diodes and transistors.

2. Prior Art

Semiconductor devices tend to be divided into discrete components and integrated circuits. The discrete devices include single function components such as bipolar transistors, junction field effect transistors, surface field effect transistors, silicon controlled rectifiers, etc. and some integrated components such as insulated gate bipolar transistors. One characteristic that is common to all the discrete components is the lack of external power supply requirements.

Recently a new form of discrete circuit has entered the market; a highly efficient diode made from surface field effect transistors, an integrated circuit diode (ICD). This circuit in its present form (passive form) does not utilize any on-chip drive circuitry; however, with the addition of either external or internal power, these circuits can improve their performance dramatically by utilizing on-chip circuitry to actively drive the transistor gates (active form).

Utilizing external power for this purpose tends to be less attractive because of the added circuit board complexity. However, it does have the advantage of not altering the external signal while drawing the charge needed for the onboard supply voltage. In most applications, the added convenience of the self-powered circuit would be advantageous.

In typical semiconductor diodes, conduction in the forward direction is limited to leakage current values until the forward voltage bias reaches a characteristic value for the particular type of semiconductor device. By way of example, silicon pn junction diodes don't conduct significantly until the forward bias voltage is approximately 0.6 to 0.7 volts. Many silicon Schottky diodes, because of the characteristics of the Schottky barrier, can begin to conduct at lower voltages, such as 0.4 volts. Germanium pn junction diodes have a forward conduction voltage drop of approximately 0.3 volts at room temperature. However, the same are rarely used, not only because of their incompatibility with silicon integrated circuit fabrication, but because of temperature sensitivity and other undesirable characteristics thereof.

In some applications, diodes are used not for their rectifying characteristics, but rather to be always forward biased to provide their characteristic forward conduction voltage drop. For instance, in integrated circuits, diodes or diode connected transistors are frequently used to provide a forward conduction voltage drop substantially equal to the base-emitter voltage of another transistor in the circuit.

In circuits that utilize the true rectifying characteristics of semiconductor diodes, the forward conduction voltage drop of the diode is usually a substantial disadvantage. By way of specific example, in a DC to DC step-down converter, a transformer is typically used wherein a semiconductor switch controlled by an appropriate controller periodically connects and disconnects the primary of the transformer with a DC power source. The secondary voltage is connected to a converter output, either through a diode for its rectifying characteristics, or through another semiconductor switch. The controller varies either the duty cycle or the frequency of the primary connection to the power source as required to maintain the desired output voltage. If a semiconductor switch is used to connect the secondary to the output, the operation of this second switch is also controlled by the controller; one form of this switch configuration circuit is called a synchronous rectifier.

Use of a semiconductor switch to couple the secondary to the output has the advantage of a very low forward conduction voltage drop, and has the disadvantage of requiring careful timing control throughout the operating temperature range of the converter to maintain the efficiency of the energy transfer from primary to secondary. Timing of the switching action for the primary versus the secondary is critical and must take into account the phase delays of the transformer and other elements. These circuits are obviously very costly.

The use of a semiconductor diode for this purpose has the advantage of eliminating the need for control of a secondary switch, but has the disadvantage of imposing the forward conduction voltage drop of the semiconductor diode on the secondary circuit. This has at least two very substantial disadvantages. First, the forward conduction voltage drop of the semiconductor diode device can substantially reduce the efficiency of the converter. For instance, newer integrated circuits commonly used in computer systems are designed to operate using lower power supply voltages, such as 3.3 volts, 3 volts and 2.7 volts. In the case of a 3 volt power supply, the imposition of a 0.7 volt series voltage drop means that the converter is in effect operating into a 3.7 volt load, thereby limiting the efficiency of the converter to 81%, even before other circuit losses are considered.

Second, the efficiency loss described above represents a power loss in the diode, resulting in the heating thereof. This limits the power conversion capability of an integrated circuit converter, and in many applications requires the use of a discrete diode with a heat sink of adequate size, increasing the overall circuit size and cost. Obviously any improvement in the forward voltage drop will have a major impact on the overall circuit performance.

Another commonly used circuit for AC to DC conversion is the full wave bridge rectifier usually coupled to the secondary winding of a transformer having the primary thereof driven by the AC power source. Here two diode voltage drops are imposed on the peak DC output, making the circuit particularly inefficient using conventional diodes, and increasing the heat generation of the circuit requiring dissipation through large discrete devices, heat dissipating structures, etc. depending on the DC power to be provided.

Therefore, a semiconductor diode having a low forward conduction voltage drop would be highly advantageous to use as a rectifying element in circuits wherein the diode will be subjected to both forward and reverse bias voltages from time to time. While such a diode may find many applications in discrete form, it would be further desirable for such a diode to be compatible with integrated circuit fabrication techniques so that the same could be realized in integrated circuit form as part of a much larger integrated circuit. Further, while reverse current leakage is always undesirable and normally must be made up by additional forward conduction current, thereby decreasing circuit efficiency, reverse current leakage can have other and more substantial deleterious affects on some circuits. Accordingly, it would also be desirable for such a semiconductor diode to further have a low reverse bias leakage current.

The ICD in its passive form provides lower forward voltages than Schottky diodes, with enhanced reliability at a competitive price. They also provide an attractive alternative for the higher voltage portion of the synchronous rectifier market; however, they are not able to replace the entire synchronous rectifier market.

BRIEF SUMMARY OF THE INVENTION

The present invention provides circuits and methods that, when integrated into an IC, will provide an on-chip power source to run control circuits on the IC. It draws its power from the applied signal during the "off" portion of the IC's cycle. For example, in the case of an IC behaving as a rectifier, the circuit will utilize the large reverse voltage during the off state of the rectifier to draw power for the supply. In the case of an IC behaving as a transistor, which does not have a reversal of the applied potential, the power supply will draw its power during the "off" state when a large bias is formed across the IC.

During the "on" state of these IC's, the power supply will provide power to drive the control circuits which can be used to generate a more conductive "on" state, and a lower leakage "off" state. In the case of an ICD, the forward voltage can be significantly reduced, to a level equivalent to or better than that of a synchronous rectifier. In the case of a surface field effect transistor IC, the gate drive can be substantially enhanced, providing a reduced "on resistance" which equates to forward voltage reduction.

DETAILED DESCRIPTION OF THE PREFERRED EMBODIMENTS

Figure 1:
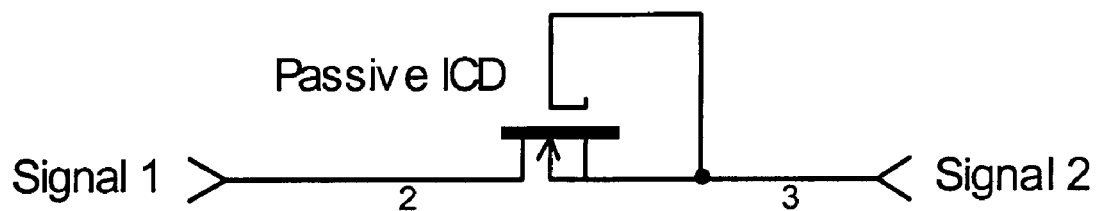
FIG. 1 is a schematic drawing of the prior art ICD. "Signal 1" (Cathode) and "Signal 2" (Anode) are the normal input signals, such as a sine wave or square wave, to the diode. The "Passive ICD" is an n-channel MOSFET device that behaves as a diode.

Referring to FIG. 1, a prior art schematic diagram of an ICD (integrated circuit diode) is presented. This device acts as a low forward voltage diode because of the gate connections, and the depletion threshold voltage. It is specifically designed to handle alternating polarities. It is obvious that the addition of an external power supply and control logic would greatly enhance the functionality of this device by allowing the gate to be driven well above the drain potential when conducting.

The device shown in FIG. 1 is an n-channel device. Normally, in a conventional field effect device, the body or backgate is connected to the source of the charge carriers when the device is turned on. In that regard, the source and drain labels, as used herein refer to the source being that region which is the source of the charge carriers when the device is turned on or conducting, and with the drain being the other region of the same conductivity type. Therefore, the charge carriers flow from the source through the channel to the drain during conduction. In the case of the ICD of FIG. 1, conduction occurs when signal 2 is a higher voltage than signal 1. Since the Figure depicts an n-channel device, and with the foregoing definition of source and drain, it will be noted that in the case of the passive integrated circuit diode (ICD), the body or backgate of the ICD is connected to the drain, not the source. Also an ICD characteristically has a slightly negative threshold. Thus, for an ICD, when the source and drain are at the same voltage, the channel is somewhat conductive, though the current is zero because the source and drain are at the same voltage. For an n-channel ICD, when the drain voltage is raised above the source voltage, the conduction along the channel will cause an IR drop in the channel, with the channel close to the source having a voltage close to the source voltage. Thus the gate-channel voltage increases in that region of the channel, reducing the channel resistance. The effect is progressive along the channel, so that most of the channel becomes closer to the source voltage and thus more highly conductive. Consequently the overall channel resistance becomes lower and lower as the drain voltage increases, supporting high current levels with a relatively low forward voltage conduction drop. On the other hand, when the source voltage is above the drain voltage, conduction in the channel causes the channel voltage next to the source to be close to that of the source, and thus to have a gate channel voltage which causes a high channel resistance in that area. Thus while leakage will increase with an increasing reverse bias voltage on the ICD, the resistance of the channel will be high, and resistance of the channel will increase with increasing reverse bias voltage, thereby increasing the resistance of the channel with increasing reverse bias voltage, thereby limiting the rise in the leakage current with increasing reverse bias voltage. This is the standard Id/Vds behavior of a MOSFET with a constant gate potential.

In usual diode terms, the Anode of a diode is the positive terminal during forward conduction, and the Cathode is the negative terminal. For the n-channel ICD the forward conduction Drain corresponds to the Anode, and the Source which is the n-type substrate to the Cathode. If one were to build a p-channel ICD the Anode would correspond to the Source which is the p-type substrate, and the Cathode to the Drain. Due to carrier mobility differences, our discussion of the ICDs will focus on the n-channel device with the understanding that changing material types and circuit polarities would produce a p-channel ICD.

For those skilled in the art, it is apparent that a JFET could be substituted for the MOSFET to form the ICD and the ICM could also be made in a JFET flavor.

In the disclosure to follow, passive n-channel ICDs and active n-channel and p-channel ICMs are referred to, the active devices being three terminal devices with separate gate connections. These devices assume a MOSFET design and have the body or backgate of the ICDs connected to the drain for the ICDs and the source for the ICMs.

The use of discrete MOSFETs driven by control logic circuitry is well known in the art; for example, synchronous rectifiers. The addition of the control logic to an IC is also well known, as is the integration of on chip power supplies such as the back gate power supplies on IC's which provide a negative potential to the substrate to control transistor thresholds; however, the integration of a selfcontained power supply into an IC without external power supply connections is new to the art. The present invention incorporates circuitry to the IC for the purpose of on-chip charge storage, acting as an effective battery to power the control logic. The energy stored in the battery is extracted from the actual signal lines during the "off" state of the IC.

Figure 2:
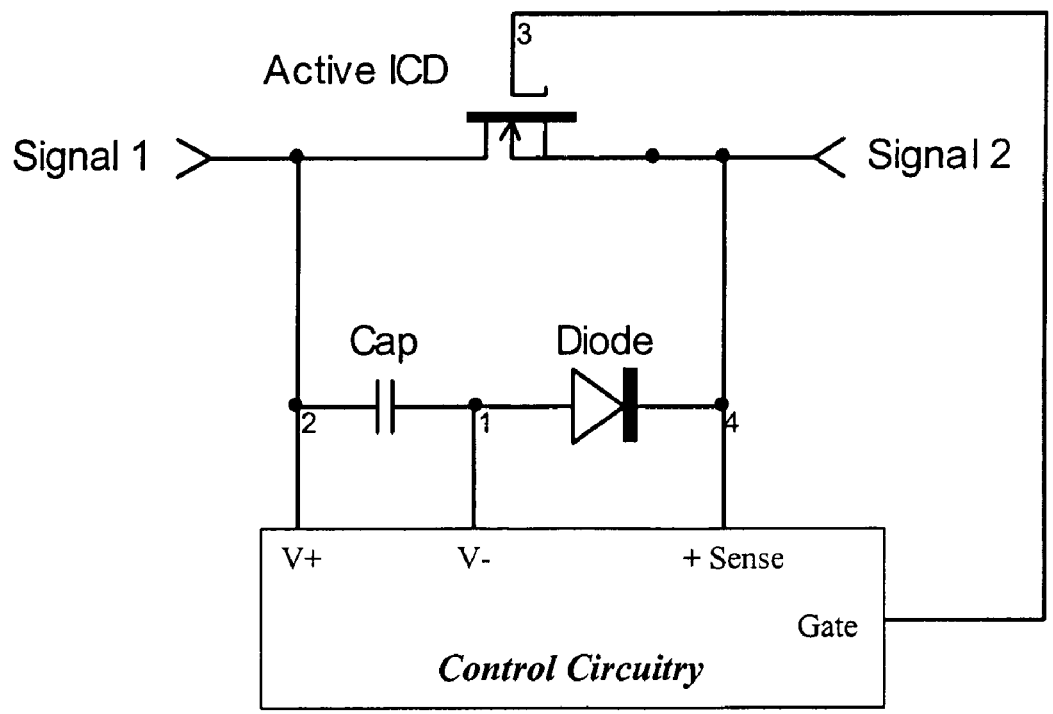
FIG. 2 presents the addition of a capacitor and diode to the ICD chip. This allows the capacitor to charge and act as a battery, powering the control circuitry to run the ICD gate.

FIG. 2 is a schematic representation of an active ICD utilizing control circuitry to power its gate electrode. The energy to drive the control circuitry is extracted from the signal lines by the addition of a capacitor and a diode. The diode allows the capacitor to charge during the reverse bias condition for the ICD (off state, no current flow but high reverse voltage) and prevents a discharge of the capacitor when the potential across the ICD drops below the charging potential, whether or not the polarity actually reverses.

As can be seen, if there is an alternating voltage across the diode and a load (load is not shown) the peak to peak voltage will be stored on the capacitor with the positive potential at the signal 1 side, and the negative potential at the signal 2 side. This effectively acts as a half wave rectifier circuit. Also, note that the control circuitry will require a sense line to synchronize its control activity with the applied signal. This sense line must be isolated from the charge storage device. In the case of FIG. 2, the diode serves as the isolation, allowing the sense potential to follow signal 2 independently of the capacitor.

Figure 2A:
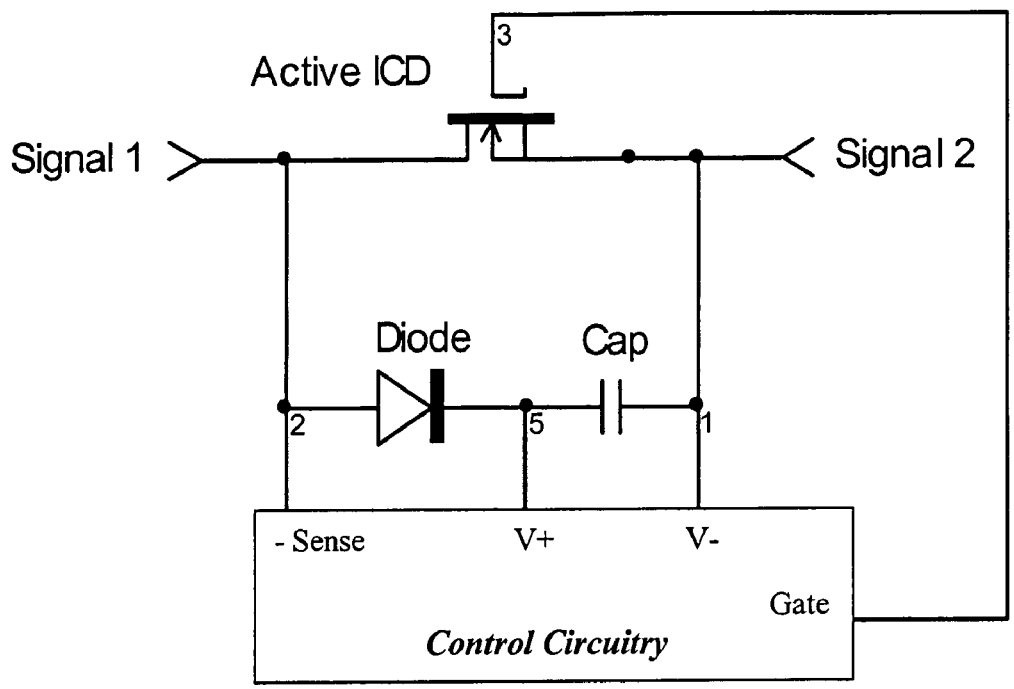
FIG. 2A presents the same concept as FIG. 2 except the diode is moved to the other side of the capacitor. This inverts the polarity of the sense signal, hence the − and + signs in FIGS. 2 and 2A.

FIG. 2A presents the configuration of FIG. 2 except the diode and capacitor are reversed in position. This moves the sense connection to signal 1; however, the polarity across the capacitor is not reversed. This configuration is arbitrarily identified with a "− sense" notation relative to FIG. 2 with a "+ sense" notation. The function of the finished ICD to the external circuit is the same for both the − and + sense configurations. It is only an internal design difference which distinguishes the two senses.

Figure 3:
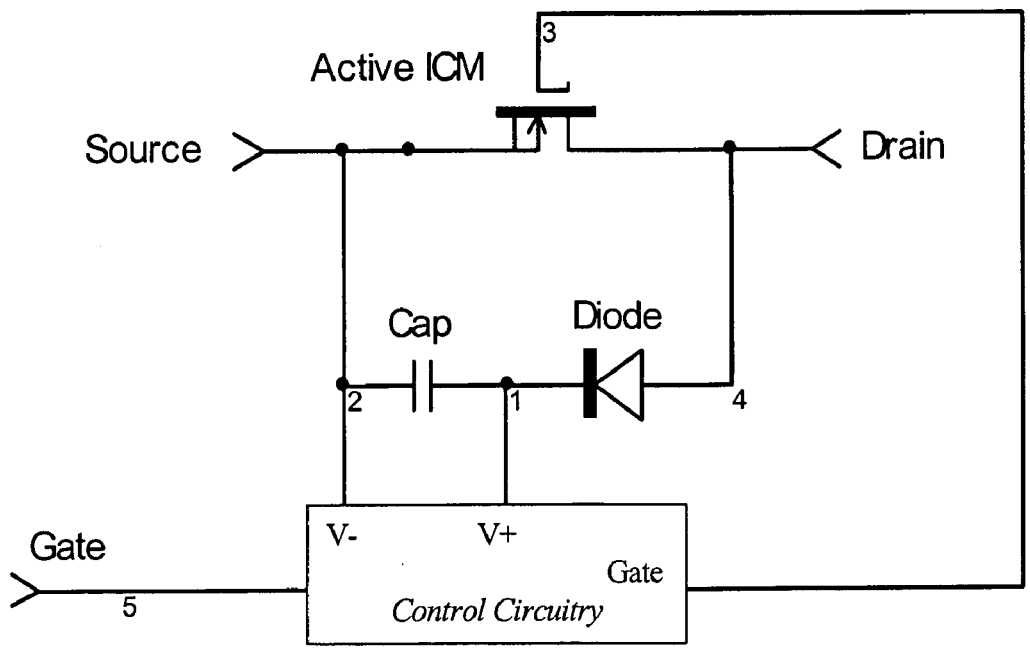
FIG. 3 presents the same concept except driving a metal oxide semiconductor field effect transistor. This Integrated Circuit MOSFET (ICM) device has external inputs corresponding to the source, drain, and gate.

It is apparent that if a standard MOSFET is substituted into this circuit, implying that there is no change in the polarity of the signal voltage, the diode can be reversed so that it will charge the capacitor during the off state of the transistor. See FIG. 3 compared to FIG. 2. This will reverse the polarity on the capacitor, requiring appropriate modification to the control circuitry. This configuration would allow a MOSFET transistor with no additional power connections to function with a very low apparent gate drive; utilizing that drive to trigger a much larger drive from the control circuitry. One of the design problems associated with power MOSFETs is providing adequate drive current for their large gate structures. The ICM eliminates this concern.

Figure 4:
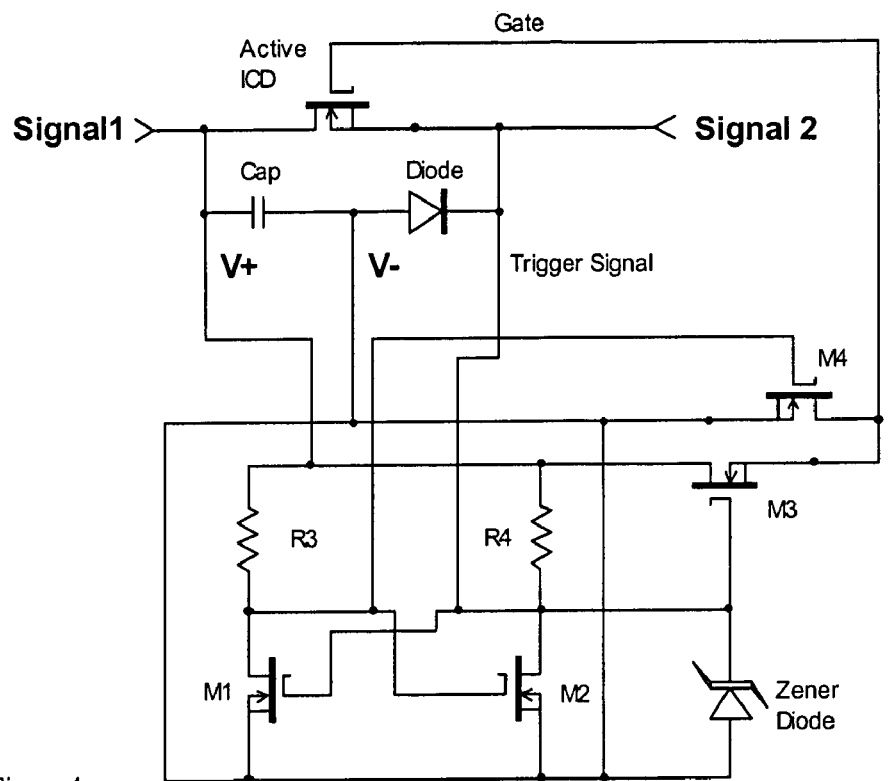
FIGS. 4 and 4A present control circuits used with the + and − sense configurations, respectively.
Figure 4A:
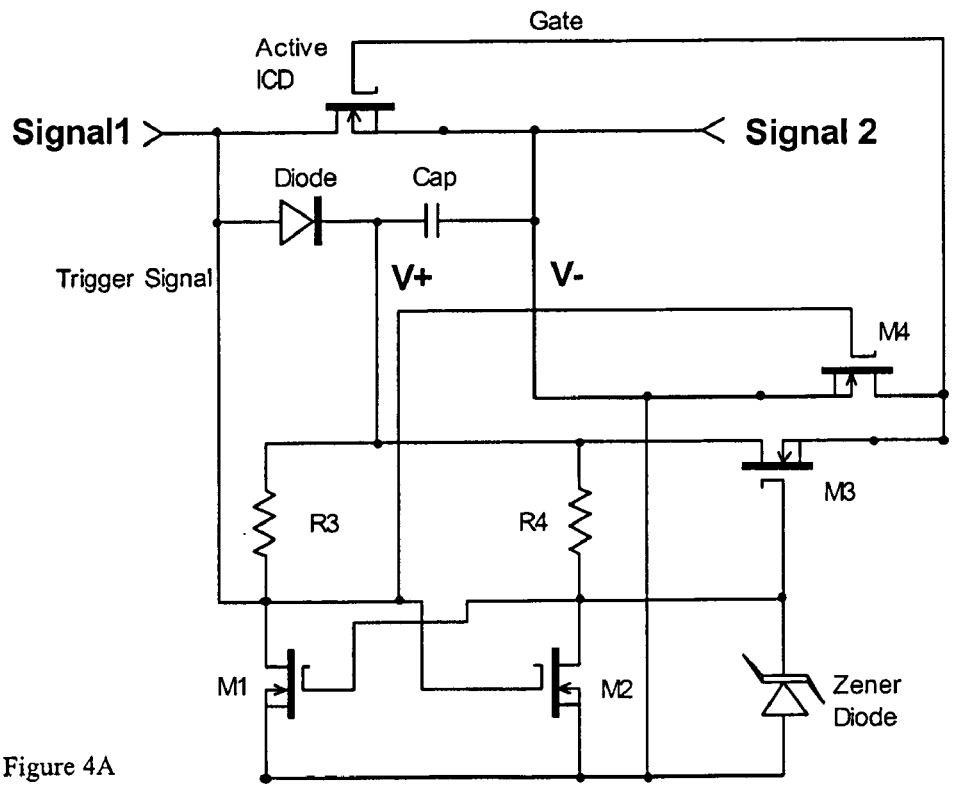

The control circuit may take many forms. The examples presented here are for demonstrating the application of the invention rather than a specific control circuitry. FIGS. 4 and 4A use identical control circuitry. Because of the different configuration of the diode and capacitor, the supply lines are routed differently, and the sense line has the polarity reversed. FIG. 4 uses the +sense configuration of FIG. 2 while FIG. 4A uses the − sense configuration of FIG. 2A.

The control circuit is designed to take the sense input, and use it to control the potential applied to the N-channel MOSFET gate. Resistors R3 and R4 and transistors M1 and M2 form a bistable latch. The state of the latch is determined by the potential of the sense signal (trigger signal in FIGS. 4 and 4A). Resistors R3 and R4 are pull-up resistors that provide power to maintain the state of the latch, while limiting the charge drain on the internal power supply. In FIG. 4, a positive trigger signal turns on transistor M1, which in turn turns off transistor M2. This causes the resistor R4-transistor M2 node to go toward V+. The Zener diode limits the extent of this voltage excursion to its rated zener voltage. This positive voltage turns on transistor M3, whose source is connected to the gate of the active ICD. When the potential of the source rises to the zener potential, the charge transfer stops, limiting the positive potential applied to the active ICD gate to the zener voltage plus a small delta.

The configuration of transistor M3 with the zener diode prevents excessive voltage on the gate of the ICD that could potentially cause a gate oxide rupture. When the trigger signal changes polarity, the state of the latch is reversed so that the gate of transistor M3 is driven negative, at the same time, the gate of transistor M4 is driven positive so that the gate of the ICD, and the source of transistor M3 are pulled negative.

As can be seen, the gate of the active ICD is driven between an off signal (V−), and a positive voltage set by the zener diode. This allows the on state of the ICD to have a much lower voltage drop than it would in the passive state of FIG. 1. Looking at FIGS. 4 and 4A, it can be seen that in both cases the V+ and V− signals are routed to the same points within the control circuit, the V+ goes to the resistor side of the latch, and the V− to the MOSFET side of the latch. The sense signal, however, is routed to the opposite latch polarity. In FIG. 4 it goes to the drain of transistor M2, while in FIG. 4A, it goes to the drain of transistor M1. This is due to the polarity reversal of the sense signal. In both circuits, the forward condition (ICD gate turned on) corresponds to Signal 1 being negative with respect to Signal 2.

While the shaping characteristics of the latch are convenient, in many cases the full latch is not required for the circuit to function correctly. For example, in FIG. 4A, if resistor R3 and transistor M1 were eliminated, the circuit would still behave properly with a well behaved input signal.

Figure 5:
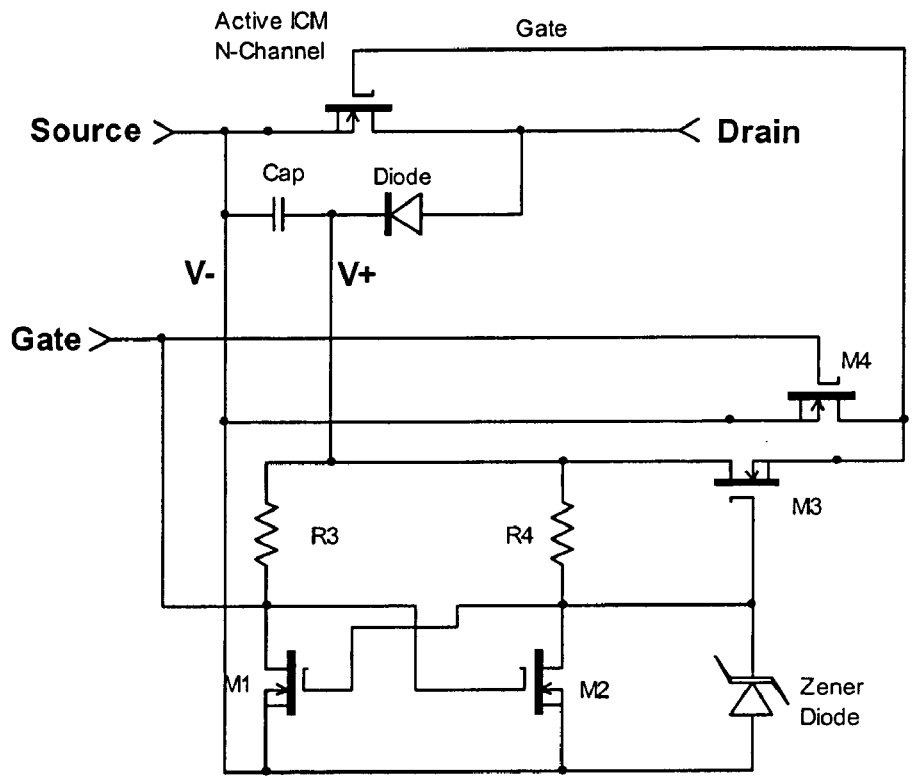
FIG. 5 presents the same type of drive circuitry as in FIGS. 4 and 4A except as modified for an n-channel MOSFET.

FIG. 5 demonstrates the same control circuit with an N-channel MOSFET. Note that the diode has been reversed so that the voltage across the ICM while it is off will charge the capacitor. The sense signal is now the gate input electrode.

Figure 6:
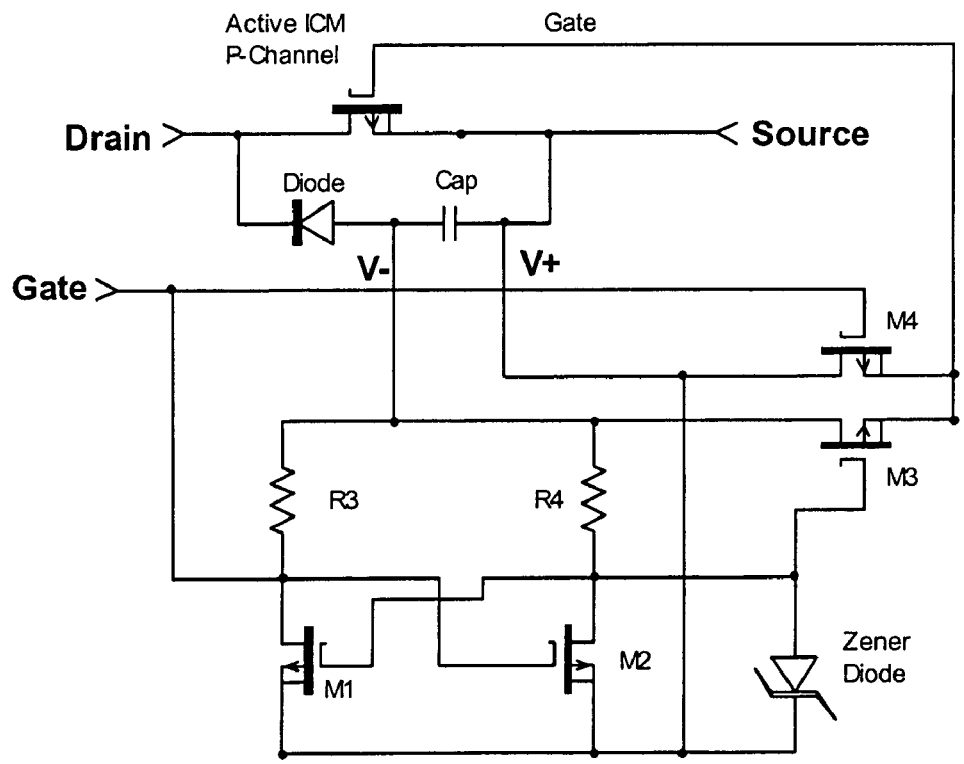
FIG. 6 presents a sample control circuit for a p-channel MOSFET.

FIG. 6 demonstrates the same control circuit, except for a p-channel MOSFET device. Note that all the MOSFETs are now p-channel devices and the polarity of the voltage to the control circuit is reversed.

In the ICM of FIGS. 5 and 6, the control circuit receives a gate control signal and provides an enhanced gate control signal to the field effect transistor. That enhanced signal may be enhanced in terms of voltage swing (larger swing), or in current drive to rapidly charge and discharge the transistor gate capacitance, particularly in the case of power transistors, in speed of the gate drive transition for increasing the speed of turn on and turn off, or any combination of these or other parameters. Also, the ICM may be used in a larger integrated circuit, or may be packaged as a three terminal device and used in place of a conventional FET for its improved performance.

While certain preferred embodiments of the present invention have been disclosed and described herein, it will be understood by those skilled in the art that various changes in form and detail may be made therein without departing from the spirit and scope of the invention.

What is claimed is:

1. An integrated circuit having an on chip power supply coupled to a field effect transistor having a source, a drain, a gate and a body, the power supply comprising:
   a charge storage device and a current directing device;
   a first terminal of the charge storage device being connected to the source of the field effect transistor, a second terminal of the charge storage device being connected to a anode of the current directing device, and an cathode of the current directing device being connected to the drain of the transistor;
   a control circuit coupled to be powered by a voltage between the first and second terminals of the charge storage device and to control the gate of the field effect transistor;
   the body of the field effect transistor being connected to the drain, the control circuit being responsive to the polarity of the voltage between the source and the drain to turn the field effect transistor on when the drain is at a positive voltage relative to the source and off when the drain is at a negative voltage relative to the source.

2. The circuit of claim 1 wherein the charge storage device is a capacitor.

3. The circuit of claim 1 wherein the current directing device is a diode.

4. The circuit of claim 1 wherein the field effect transistor is an n-channel MOSFET.

5. The circuit of claim 1 wherein the field effect transistor is an n-channel JFET.

6. The circuit of claim 1 wherein the field effect transistor functions as a rectifying diode.

7. A circuit comprising:
   an integrated circuit including a charge storage device, a current directing device, a field effect transistor having a body, a source, a drain and a gate, and a control circuit, the drain being connected to the body, the charge storage device and the current directing device being connected in series between the source and drain terminals of the transistor, a charge on the charge storage device being coupled to and acting as the power supply for the control circuit, the control circuit having an output coupled to the gale of the field effect transistor, the control circuit turning the transistor on when the voltage between the source and drain is of a first polarity, and off when the voltage between the source and drain is of a second polarity, the current directing device having a polarity to charge the charge storage device when the voltage between the source and drain is of a second polarity.

8. The circuit of claim 7 wherein the charge storage device is a capacitor.

9. The circuit of claim 8 wherein the current directing device is a diode.

10. The circuit of claim 7 wherein the field effect transistor is an integrated circuit diode having its gate connected to the control circuit.

11. The circuit of claim 7 wherein the circuit is packaged as a two tenninal device.

12. The circuit of claim 7 wherein the transistor is a FET.

13. The circuit of claim 7 wherein the FET is an n-channel MOSFET.

14. The circuit of claim 7 wherein the FET is a p-channel MOSFET.

15. The circuit of claim 7 wherein the FET is an n-channel JFET.

16. The circuit of claim 7 wherein the FET is a p-channel JFET.

17. A circuit comprising:
   an integrated circuit including:
   a capacitor;
   a diode;
   an n-channel field effect transistor having a source, a drain, a gate and a body connected to the drain; and,
   a control circuit;
   the capacitor and the diode being connected in series between the source and drain with the diode being conductive to charge the capacitor when the source is at a higher voltage than the drain, the capacitor being coupled to and acting as the power supply for the control circuit, the control circuit having an output coupled to the gate of the field effect transistor, the control circuit turning the transistor on when the voltage on the drain is higher than the voltage on the source, and off when the voltage on the source is higher than the voltage on the drain.

18. The circuit of claim 17 wherein the field effect transistor has a channel that is conductive when the source and gate are at the same voltage.

19. The circuit of claim 17 wherein the circuit is packaged as a two terminal device.

* * * * *